US011139293B2

(12) United States Patent
Ichikawa et al.

(10) Patent No.: US 11,139,293 B2
(45) Date of Patent: Oct. 5, 2021

(54) PHOTON DETECTOR

(71) Applicant: HAMAMATSU PHOTONICS K.K., Hamamatsu (JP)

(72) Inventors: Minoru Ichikawa, Hamamatsu (JP); Kazuki Fujita, Hamamatsu (JP)

(73) Assignee: HAMAMATSU PHOTONICS K.K., Hamamatsu (JP)

(*) Notice: Subject to any disclaimer, the term of this patent is extended or adjusted under 35 U.S.C. 154(b) by 107 days.

(21) Appl. No.: 16/348,599

(22) PCT Filed: Nov. 16, 2017

(86) PCT No.: PCT/JP2017/041261
§ 371 (c)(1),
(2) Date: May 9, 2019

(87) PCT Pub. No.: WO2018/097025
PCT Pub. Date: May 31, 2018

(65) Prior Publication Data
US 2020/0066715 A1 Feb. 27, 2020

(30) Foreign Application Priority Data
Nov. 25, 2016 (JP) .............................. JP2016-229097

(51) Int. Cl.
*H01L 27/07* (2006.01)
*G01J 1/46* (2006.01)
(Continued)

(52) U.S. Cl.
CPC ........ *H01L 27/0727* (2013.01); *G01J 1/4228* (2013.01); *G01J 1/46* (2013.01); *G01J 2001/442* (2013.01); *G01J 2001/4473* (2013.01)

(58) Field of Classification Search
CPC .... H01L 27/0727; H01L 31/08; G01J 1/4228; G01J 1/46; G01J 2001/442;
(Continued)

(56) References Cited

U.S. PATENT DOCUMENTS 5,866,907 A * 2/1999 Drukier ................. G01T 1/2008
250/366
6,054,705 A * 4/2000 Carroll ................. G01N 23/083
250/214 A
(Continued)

FOREIGN PATENT DOCUMENTS

CN 1661803 A 8/2005
CN 101453275 A 6/2009
(Continued)

OTHER PUBLICATIONS

International Preliminary Report on Patentability dated Jun. 6, 2019 for PCT/JP2017/041261.
(Continued)

*Primary Examiner* — Seung C Sohn
(74) *Attorney, Agent, or Firm* — Faegre Drinker Biddle & Reath LLP

(57) ABSTRACT

The present embodiment relates to a photon detector which includes a preamplifier having a structure capable of preventing saturation of an amplifier. The preamplifier includes an amplifier, and further includes a capacitive element, an n-type MOSFET, and a p-type MOSFET disposed on a plurality of wirings electrically connecting the input end side and the output end side of the amplifier. A control electrode of the n-type MOSFET is set to a first fixed potential V1, while a control electrode of the p-type MOSFET is set to a second fixed potential V2.

9 Claims, 12 Drawing Sheets

(51) Int. Cl.
*G01J 1/42* (2006.01)
*G01J 1/44* (2006.01)

(58) Field of Classification Search
CPC . G01J 2001/4473; H04N 5/3745; H04N 5/32; H04N 5/378; G01T 1/17
See application file for complete search history.

(56) References Cited

U.S. PATENT DOCUMENTS

| | | | |
|---|---|---|---|
| 6,710,343 B2* | 3/2004 | Wood | G01J 5/12 250/338.1 |
| 9,759,822 B2* | 9/2017 | Daerr | G01T 1/249 |
| 2008/0224054 A1 | 9/2008 | Lehmann et al. | |
| 2010/0172467 A1 | 7/2010 | Steadman Booker et al. | |
| 2010/0329425 A1 | 12/2010 | Guo et al. | |
| 2012/0098508 A1 | 4/2012 | Zhu | |
| 2014/0084989 A1 | 3/2014 | Fujime et al. | |
| 2014/0091228 A1 | 4/2014 | Yamakawa et al. | |
| 2017/0187939 A1* | 6/2017 | Kasuga | G01J 1/44 |

FOREIGN PATENT DOCUMENTS

| | | |
|---|---|---|
| CN | 101854209 A | 10/2010 |
| CN | 103383545 A | 11/2013 |
| CN | 103808710 A | 5/2014 |
| CN | 203705647 U | 7/2014 |
| CN | 105765405 A | 7/2016 |
| JP | H03-26980 A | 2/1991 |
| JP | H08-129070 A | 5/1996 |
| JP | 2007-535728 A | 12/2007 |
| JP | 2015-115357 A | 6/2015 |
| JP | 2016-19725 A | 2/2016 |
| JP | 2016-534374 A | 11/2016 |
| WO | WO-2005/081810 A2 | 9/2005 |
| WO | WO 2014/097519 A1 | 6/2014 |

OTHER PUBLICATIONS

Ikeda Hirokazu, "Electronics for Particle Measurement", School of Mathematical and Physical Science, The Graduate University for Advanced Studies, Jun. 28, 2002, pp. 1-11 (with English-language translation).

Ikeda Hirokazu, "Analog-VLSI Open-IP (9) for Advanced Sensor Signal Processing" Japan Aerospace Exploration Agency (JAXA) Institute of Space and Astronautical Science, Aug. 22, 2004, pp. 153-166 (with attached English-language translation).

Rafael Ballabriga et al., "The Medipix3RX: a high resolution, zero dead-time pixel detector readout chip allowing spectroscopic imaging", 14th International Workshop on Radiation Imaging Detectors, Jul. 2012, pp. 1-15.

Rafael Ballabriga, "The Design and Implementation in 0.13µm CMOS of an Algorithm Permitting Spectroscopic Imaging with High Spatial Resolution for Hybrid Pixel Detectors", Universitat Ramon Llull, CERN-THESIS-2010-055, Nov. 24, 2009, 190 pages.

Qi Lan et al., "A Feasible Method for Detecting 1.5 µm Single Photon Based on Capacitance Nature of Avalanche Photodiode," Acta Sinica Quantum Optica, vol. 3, Aug. 25, 2013 (with English Abstract).

* cited by examiner

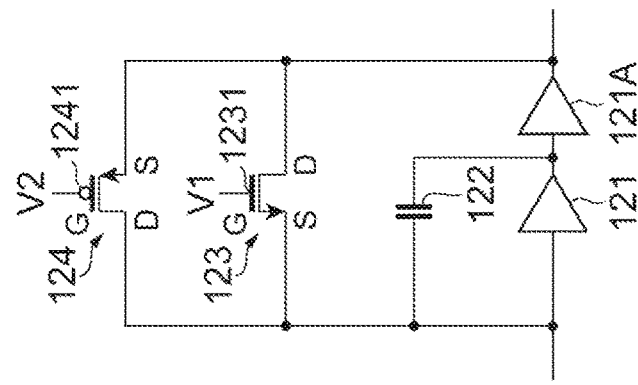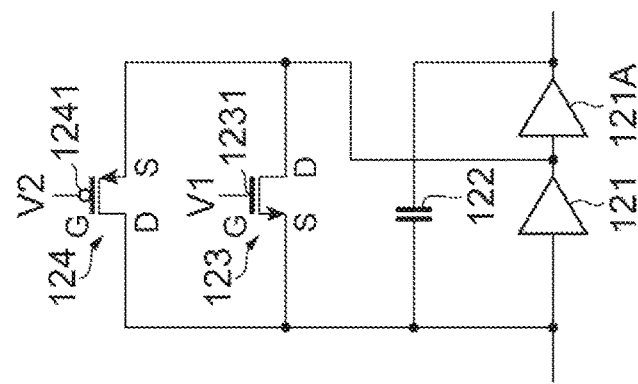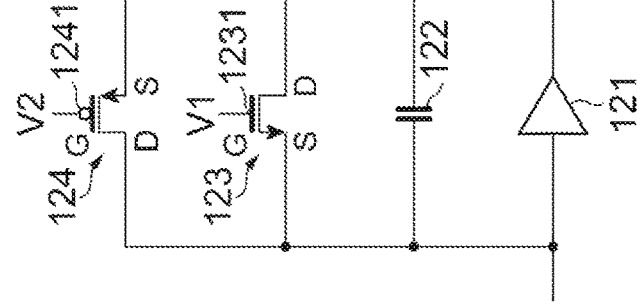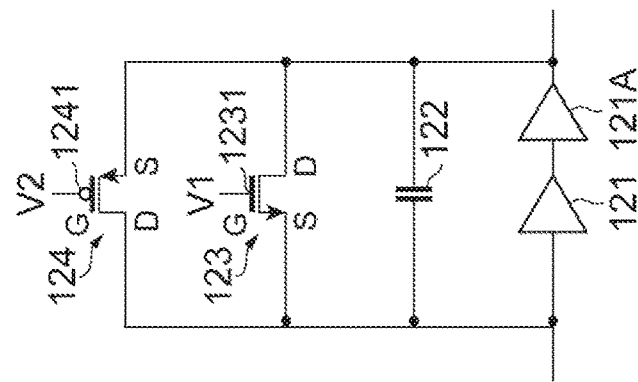

PHOTON DETECTOR

TECHNICAL FIELD

The present invention relates to a photon detector.

BACKGROUND ART

A photon detector equipped on an X-ray imaging device and the like is conventionally known. For example, Patent Document 1 describes a semiconductor X-ray detector as a constituent element of a photon detector equipped on an X-ray imaging device. This semiconductor X-ray detector is constituted by a sensor element for detecting X-rays, and an integration circuit. The integration circuit is constituted by an amplifier formed by an operational amplifier or the like, a capacitor connected in parallel to the amplifier, and a resistance element connected in parallel to the amplifier. According to the semiconductor X-ray detector thus configured, a predetermined amount of electric charges are accumulated in the capacitor every time an X-ray enters the sensor element. In this case, an output voltage of the amplifier rises stepwise. The output voltage from the amplifier is differentiated by a shaping amplifier or the like connected to a subsequent stage, and is outputted as a count pulse. An X-ray incident amount is measured based on a count value of the count pulse. Patent Document 1 also discloses a configuration which includes a transistor constituting a resistance element. The transistor has a gate (base) connected to a drain (collector), and is connected in parallel to the capacitor.

CITATION LIST

Patent Literature
Patent Document 1: Japanese Patent Application Laid-Open No. H8-129070
Patent Document 2: Japanese Patent Application Laid-Open No. 2015-115357
Non-Patent Literature
Non-Patent Document 1: Hirokazu Ikeda. "Electronics for Particle Measurement", Internet <URL: http://research.kek.jp/people/ikeda/KEK_REPORT2002-8/Electronics/day_5.pdf>, Jun. 28, 2002
Non-Patent Document 2: Hirokazu Ikeda "Analog-VLSI Open-I (9) for Advanced Sensor Signal Processing", Internet <URL: http://research.kek.jp/people/ikeda/openIP/openIP_9.pdf>, pp. 153-165, Aug. 22, 2004
Non-Patent Document 3: R. Ballabriga, et al., "The Medipix 3 RX: a high resolution, zero dead-time pixel detector readout chip with spectroscopic imaging", PUBLISHED BY IPO PUBLISHING FOR SISSA MEDIALAB, 14$^{th}$ INTERNATIONAL WORDHOP ON RADIATION IMAGING DETECTORS, 1-5 Jul. 2012.
Non-Patent Document 4: Rafael Ballabriga Sune, "The Design and Implementation in 0.13 μm CMOS of an Algorithm Permitting Spectroscopic Imaging with High Spatial Resolution for Hybrid Pixel Detectors", CERN-THESIS-2010-055. Page 126, Nov. 24, 2009

SUMMARY OF INVENTION

Technical Problem
The inventors examined the conventional photon detector, and found following problems. A semiconductor X-ray detector constituted by a sensor element for detecting X-rays, and an integration circuit (constituted by amplifier formed by operational amplifier or the like, capacitor connected in parallel to the amplifier, and resistance element connected in parallel to the amplifier) is applicable not only to a photon detector of a type which counts a number while discriminating magnitude of incident photon energy as assumed in Patent Document 1, but also to a photon detector of a type which detects magnitude of incident photon energy. The semiconductor X-ray detector performs processing up to initial stage amplification of these types of photon detector. The section of the integration circuit is also called a preamplifier. According to this preamplifier, a resistance element connected in parallel to a capacitor is required to have a large resistance value of several hundred kilohms to several ten megohms to obtain such a characteristic that an output signal of the preamplifier securely rises in response to entrance of a photon, and falls at an appropriate time constant. On the other hand, the preamplifier preferably has a small volume for high-level integration. Further required for the preamplifier is such a structure which prevents saturation of the amplifier even when the number of incident photons per unit time increases.

The present invention has been developed to solve the aforementioned problems. It is an object of the present invention to provide a photon detector which includes a preamplifier provided with a resistor having a small volume but having a large resistance value, and capable of preventing saturation of an amplifier.

Solution to Problem

A photon detector according to the present embodiment includes at least a sensor element, a preamplifier, a waveform shaping circuit, and a comparator. The sensor element is an electronic device for detecting photons, and outputs electrons or holes corresponding to magnitude of energy of incident photons. The preamplifier integrates electric charges of the electrons or holes outputted from the sensor element, converts the obtained integrated value into a voltage signal, and amplifies the converted voltage signal. The waveform shaping circuit shapes an output waveform received from the preamplifier. The comparator compares an output signal received from the waveform shaping circuit with a reference voltage, and outputs a pulse when a voltage level of the output signal from the waveform shaping circuit exceeds the reference voltage. Particularly, the preamplifier includes a first amplifier, a capacitive element, a first transistor, and a second transistor. The first amplifier has an input end and an output end. The capacitive element is an electronic component which has a first end electrically connected to the input end of the first amplifier, and a second end electrically connected to the output end of the first amplifier. The first transistor is an electronic component configured such that a resistance value increases as an absolute value of an output voltage of the first amplifier increases, and including a first electrode electrically connected to the input end side of the first amplifier, a second electrode electrically connected to the output end side of the first amplifier, and a control electrode electrically connected to a first fixed potential. A second transistor is an electronic component configured such that a resistance value decreases as the absolute value of the output voltage of the first amplifier increases, and having a conductivity type different from a conductivity type of the first transistor. The second transistor includes a first electrode electrically connected to the input end side of the first amplifier, a second electrode electrically connected to the output end side of the first amplifier, and a control electrode electrically connected to a second fixed potential.

Advantageous Effects of Invention

Provided according to the present invention is a photon detector which includes a preamplifier provided with a resistor having a small volume but having a large resistance value, and capable of preventing saturation of an amplifier.

BRIEF DESCRIPTION OF DRAWINGS

FIGS. 3A to 3D are diagrams showing modified examples of the preamplifier.

FIGS. 11A to 11C are diagrams for explaining an effect of the p-type MOSFET as a second transistor included in the preamplifier according to the first embodiment, wherein: FIG. 11A shows a waveform diagram of respective parts when the number of incident photons per unit time is small; FIG. 11B is a waveform diagram of respective parts when the number of incident photons per unit time increases in the absence of a p-type MOSFET; and FIG. 11C is a waveform diagram of respective parts when the number of photons incident per unit time increases in the presence of a p-type MOSFET.

DESCRIPTION OF EMBODIMENTS

[Description of Embodiment of Present Invention]

Figure 1:
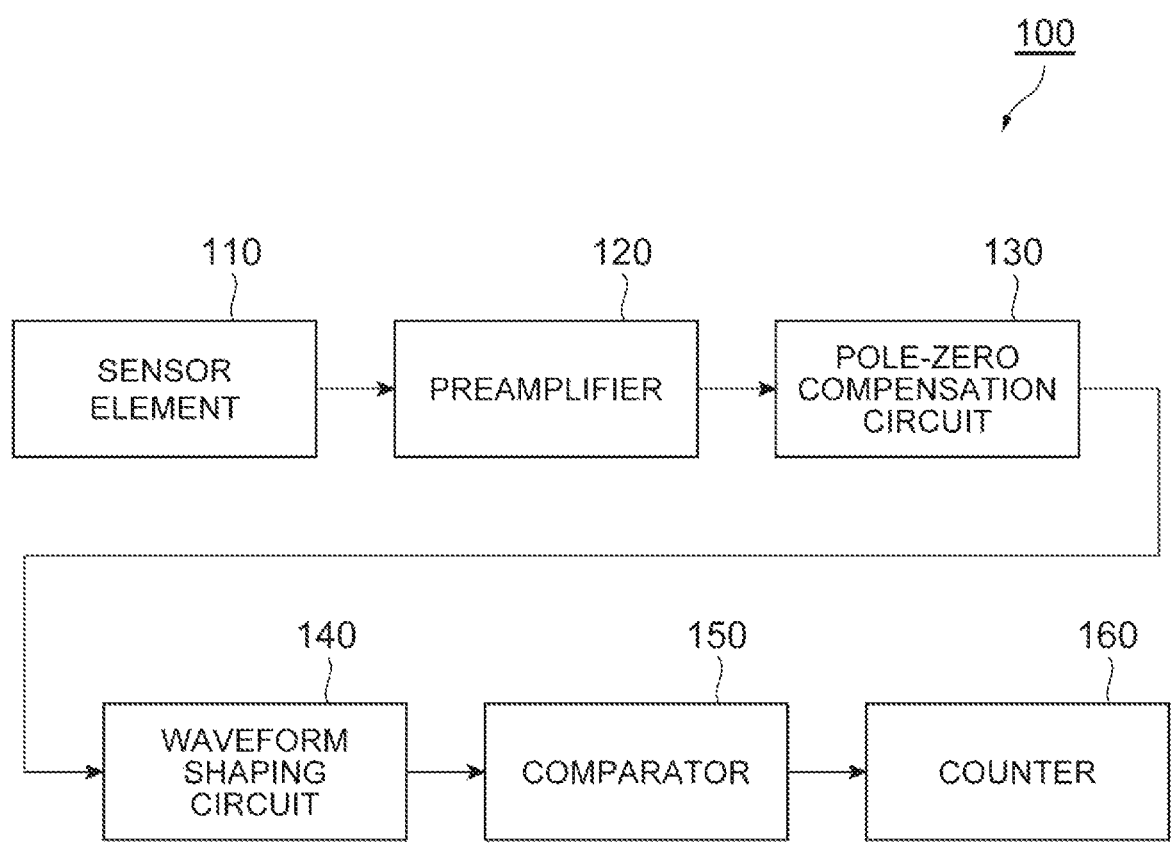
FIG. 1 is a block diagram showing a configuration example of a photon detector according to a first embodiment.

Details of an embodiment of the present invention will be initially described one by one.

(1) A photon detector according to an aspect of the present embodiment includes at least a sensor element, a preamplifier, a waveform shaping circuit, and a comparator. The sensor element is an electronic device for detecting photons, and outputs electrons or holes corresponding to magnitude of energy of incident photons. The preamplifier integrates electric charges of the electrons or holes outputted from the sensor element, converts the obtained integrated value into a voltage signal, and amplifies the converted voltage signal. The waveform shaping circuit shapes an output waveform received from the preamplifier. The comparator compares an output signal received from the waveform shaping circuit with a reference voltage, and outputs a pulse when a voltage level of the output signal from the waveform shaping circuit exceeds the reference voltage. Particularly, the preamplifier includes a first amplifier, a capacitive element, a first transistor, and a second transistor. The first amplifier has an input end and an output end. The capacitive element is an electronic component which has a first end electrically connected to the input end of the first amplifier, and a second end electrically connected to the output end of the first amplifier. The first transistor is an electronic component configured such that a resistance value increases as an absolute value of an output voltage of the first amplifier increases, and including a first electrode electrically connected to the input end side of the first amplifier, a second electrode electrically connected to the output end side of the first amplifier, and a control electrode electrically connected to a first fixed potential. A second transistor is an electronic component configured such that a resistance value decreases as the absolute value of the output voltage of the first amplifier increases, and having a conductivity type different from a conductivity type of the first transistor. The second transistor includes a first electrode electrically connected to the input end side of the first amplifier, a second electrode electrically connected to the output end side of the first amplifier, and a control electrode electrically connected to a second fixed potential.

As an aspect of the present embodiment, the preamplifier may further include one or more second amplifiers disposed in series on the output end side of the first amplifier to implement a structure for multistage amplification of a signal input to the input end of the first amplifier. In this case, each potential of the second end of the capacitive element, the second electrode of the first transistor, and the second electrode of the second transistor is set to a potential identical to a potential of either one of the output ends of the first and second amplifiers.

The first and second transistors of the photon detector having this configuration function as resistors. Accordingly, the preamplifier provided herein has a small volume but a large resistance value. In addition, the resistance value of the second transistor decreases in such a voltage range of amplifier output where the resistance value of the first transistor approaches infinity. Accordingly, prevention of amplifier output saturation is also achievable. Furthermore, the voltage range where the first transistor functions as an appropriate resistor, and the voltage range where the second transistor functions as an appropriate resistor are individually adjustable by controlling the first fixed potential and the second fixed potential. Accordingly, in comparison with "an integration circuit where a transistor, which has a gate (base) connected to a drain (collector) and functions as a resistance element of Patent Document 1, is connected in parallel to a capacitor" (hereinafter simply referred to as "integration circuit of Patent Document 1"), and a circuit which does not include the first transistor of the present embodiment but includes only the second transistor, the circuit of the preamplifier of the photon detector provided herein is applicable to a wide voltage range, and does not easily cause saturation.

(2) According to an aspect of the present embodiment, the photon detector may further include a counter configured to count the number of pulses outputted from the comparator. In this case, the photon detector having this configuration is allowed to become a photon detector of a type which counts the number of incident photons.

(3) According to an aspect of the present embodiment, the photon detector may further include a peak hold circuit. The peak hold circuit holds a peak value of the output signal of the waveform shaping circuit, and outputs an electric signal corresponding to the peak value held at timing defined by the output signal from the comparator. In this case, the photon detector having this configuration is allowed to become a photon detector of a type which detects magnitude of energy of incident photons.

(4) According to an aspect of the present embodiment, the sensor element may be an element which outputs electrons in accordance with magnitude of photon energy. In this case, it is preferable that the first transistor is an n-type MOSFET, and that the second transistor is a p-type MOSFET. According to the configuration of this aspect, more reduction of power consumption is achievable than a configuration which uses a bipolar transistor as a transistor. Accordingly, the configuration of this aspect provides the first and second transistors described above as preferable transistors capable of easily achieving size reduction of the photon detector.

(5) According to an aspect of the present embodiment, the sensor element may be an element which outputs holes in accordance with magnitude of photon energy. In this case, it is preferable that the first transistor is a p-type MOSFET, and that the second transistor is an n-type MOSFET. According to the configuration of this aspect, more reduction of power consumption is achievable than a configuration which uses a bipolar transistor as a transistor. Accordingly, the configuration of this aspect provides the first and second transistors described above as preferable transistors capable of easily achieving size reduction of the photon detector.

(6) According to an aspect of the present embodiment, the photon detector may include a pole-zero compensation circuit between the preamplifier and the waveform shaping circuit. The configuration of this aspect can reduce a change of a baseline of the output of the waveform shaping circuit, which change has been produced by a low frequency component of the preamplifier output. In this case, accuracy increases when the comparator counts magnitude of incident photon energy while discriminating the magnitude in one level or a plurality of levels, or detects magnitude of incident photon energy. This effect is also more advantageous in comparison with the semiconductor X-ray detector including the integration circuit of Patent Document 1. Specifically, the pole-zero compensation circuit is a circuit difficult to adopt in the post stage of the integration circuit of Patent Document 1. The reason why this circuit is difficult to adopt is that matching between the integration circuit of the Patent Document 1 and the pole-zero compensation circuit is difficult by a difficulty in free adjustment of the resistance value of the transistor (resistance value is determined only by potentials of source (emitter) and drain (collector) and size of transistor). According to the present embodiment, the first fixed potential and the second fixed potential are adjustable to any potentials, wherefore no difficulty is produced in this point.

(7) According to an aspect of the present embodiment, the comparator may include a reference voltage generation circuit which includes a source follower circuit, and a variable current source connected to an output node of the source follower circuit. In this case, adjustment of detection sensitivity can be made with ease and high accuracy for each pixel corresponding to one sensor element. According to one aspect of the present embodiment, a back gate of an input MOSFET constituting a part of the source follower circuit may be connected to an output node of the source follower circuit. In this case, linearity of an output voltage change of the source follower circuit with respect to a current change of the variable current source improves. In addition, a variable range of the output voltage becomes wider.

The respective aspects listed in the [Description of Embodiment of Present Invention] are applicable to each of the remaining all aspects, or to all combinations of the remaining aspects.

Details of Embodiment of Present Invention

A specific structure of a photon detector according to the present embodiment will be hereinafter described in detail with reference to the accompanying drawings. The present invention is not limited to the examples described herein. It is therefore intended that all modifications presented in the claims, and included within meanings and ranges equivalent to the claims. In the description of the drawings, identical elements are given identical reference numerals, and are not repeatedly explained.

First Embodiment (Circuit Configuration)

FIG. 1 is a block diagram showing a configuration example of a photon detector 100 according to a first embodiment. The photon detector 100 of the present embodiment is a device which may also be called a "photon counting detector". As shown in FIG. 1, the photon detector 100 includes a sensor element 110, a preamplifier 120, a pole-zero compensation circuit 130, a waveform shaping circuit 140, a comparator 150, and a counter 160. These circuit elements are connected in series in this order. In addition, the preamplifier 120, the pole-zero compensation circuit 130, the waveform shaping circuit 140, the comparator 150, and the counter 160 constitute a single signal processing system.

The sensor element 110 is an element (electronic device) which outputs electrons corresponding to magnitude of energy of incident photons. For example, the sensor element 110 is an element configured to apply a negative high voltage to a charging electrode disposed on one surface of a compound semiconductor, and extract electrons corresponding to magnitude of energy of photons from a collecting electrode disposed on another surface. A specific structure of the sensor element 110 is disclosed in Patent Document 2 described above. A typical example of the sensor element 110 is a single element (constituting one pixel) corresponding to the single signal processing system described below with one-to-one correspondence. A pixel group of a sensor array may be constituted by a plurality of the sensor elements 110 two-dimensionally disposed to constitute a configuration for the single signal processing system with one-to-many correspondence.

Figure 2:
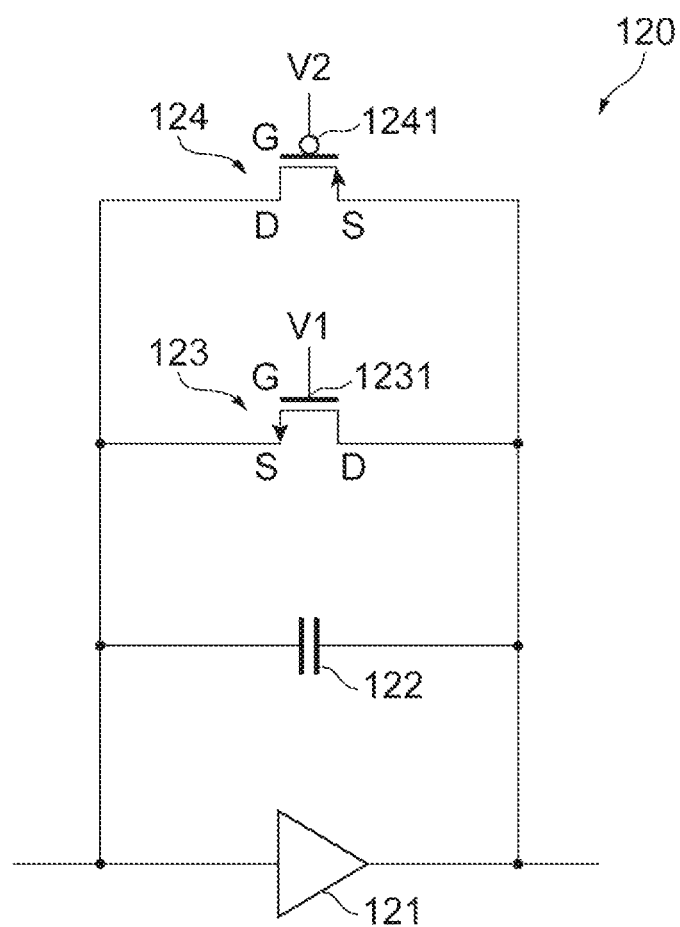
FIG. 2 is a circuit diagram showing a configuration example of a preamplifier included in the photon detector according to the first embodiment.

The preamplifier 120 is a circuit which integrates electric charges of electrons outputted from the sensor element 110, converts an integrated value thus obtained into a voltage signal, and amplifies the converted voltage signal. FIG. 2 is a circuit diagram showing a configuration example of the preamplifier 120 of the present embodiment. As shown in FIG. 2, the preamplifier 120 includes an amplifier (first amplifier) 121, and a capacitive element 122, an n-type MOSFET 123 (first transistor), and a p-type MOSFET 124 (second transistor) disposed on a plurality of wirings which electrically connect the input end side and the output end side of the amplifier 121. Accordingly, an input end of the amplifier 121 (including input electrode), a first end of the capacitive element 122, a first electrode (source S) of the n-type MOSFET 123, and a first electrode (drain D) of the p-type MOSFET 124 have the same potential. On the other hand, an output end of the amplifier 121 (including output electrode), a second end of the capacitive element 122, a second electrode (drain D) of the n-type MOSFET 123, and a second electrode (source S) of the p-type MOSFET 124 have the same potential. Gates G (control electrodes) 1231 and 1241 of the n-type MOSFET 123 and the p-type MOSFET 124 are connected to wirings for applying a first fixed potential V1 and a second fixed potential V2, respectively.

The first fixed potential V1 herein is set to such a value at which the n-type MOSFET 123 operates as defined in following (a) or (b).

(a) A resistance value between the drain and source becomes an appropriate value (e.g., several hundred kilohms to several ten megohms) in a range where an output voltage V0 of the amplifier 121 is relatively low.

(b) The resistance value between the drain and source approaches infinity as the output voltage V0 of the amplifier 121 increases.

The second fixed potential V2 herein is set to such a value at which the p-type MOSFET 124 operates as defined in following (a) or (b).

(a) The resistance value between the drain and source becomes almost infinite in a range where the output voltage V0 of the amplifier 121 is relatively low.

(b) The resistance value between the drain and source becomes an appropriate value as the output voltage V0 of the amplifier 121 increases.

The output voltage V1 of the amplifier 121 is the potential difference between the potential (reference potential) on the input electrode side of the amplifier 121 and the potential on the output electrode side.

The preamplifier 120 may have a structure for multistage amplification of a signal input to the input end of the amplifier 121. In examples shown in FIGS. 3A to 3D, a multistage amplification structure is constituted by the amplifier 121, and a post-stage amplifier (second amplifier) 121A disposed in series on the output end side of the amplifier 121. In addition, each of the second end of the capacitive element 122, the second electrode of the n-type MOSFET 123, and the second electrode of the p-type MOSFET 124 is electrically connected to the output end side of the amplifier 121. While only the one post-stage amplifier 121A is shown in the examples of FIGS. 3A to 3D, a plurality of the post-stage amplifiers 121A may be disposed in series on the output side of the amplifier 121.

More specifically, in the example of FIG. 3A, each of the second end of the capacitive element, the second electrode of the n-type MOSFET 123, and the second electrode of the p-type MOSFET 124 is connected to a wiring extending from the output end of the post-stage amplifier 121A to be set to the same potential as the potential of the output end of the post-stage amplifier 121A. In the example of FIG. 3B, each of the second end of the capacitive element, the second electrode of the n-type MOSFET 123, and the second electrode of the p-type MOSFET 124 is connected to a wire connecting the output end of the amplifier 121 and the input end of the post-stage amplifier 121A to be set to the same potential as the potential of the output end of the amplifier 121. In the example of FIG. 3C, the second end of the capacitive element is connected to a wiring extending from the output end of the post-stage amplifier 121A to be set to the same potential as the potential of the output end of the post-stage amplifier 121A. On the other hand, each of the second electrode of the n-type MOSFET 123 and the second electrode of the p-type MOSFET 124 is connected to a wiring connecting the output end of the amplifier 121 and the input end of the post-stage amplifier 121A to be set to the same potential as the potential of the output end of the amplifier 121. In the example of FIG. 3D, the second end of the capacitive element is connected to a wiring connecting the output end of the amplifier 121 and the input end of the post-stage amplifier 121A to be set to the same potential as the potential of the output end of the amplifier 121. On the other hand, each of the second electrode of the n-type MOSFET 123 and the second electrode of the p-type MOSFET 124 is connected to a wiring extending from the output end of the post-stage amplifier 121A to be set to the same potential as the potential of the output end of the post-stage amplifier 121A.

Figure 4A:
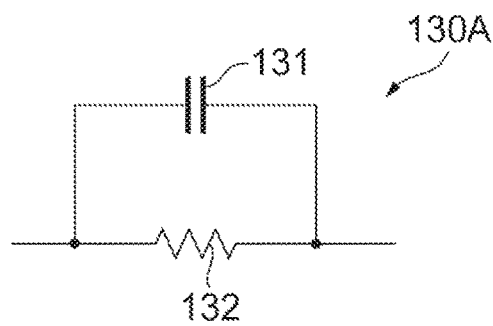
FIGS. 4A to 4D are circuit diagrams showing configuration examples of a pole-zero compensation circuit included in the photon detector according to the first embodiment.
Figure 4B:
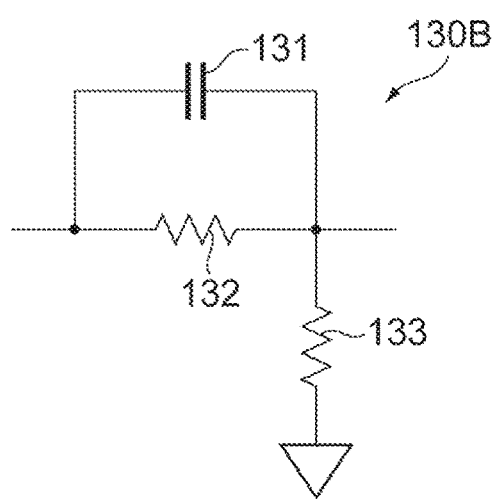
Figure 4C:
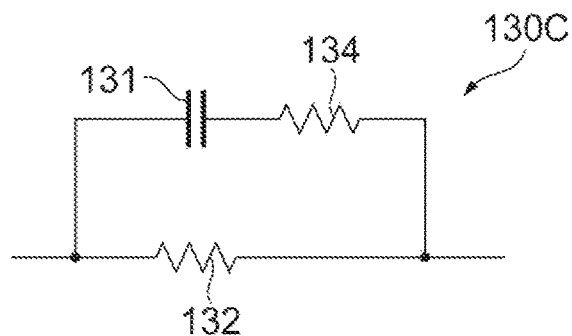
Figure 4D:
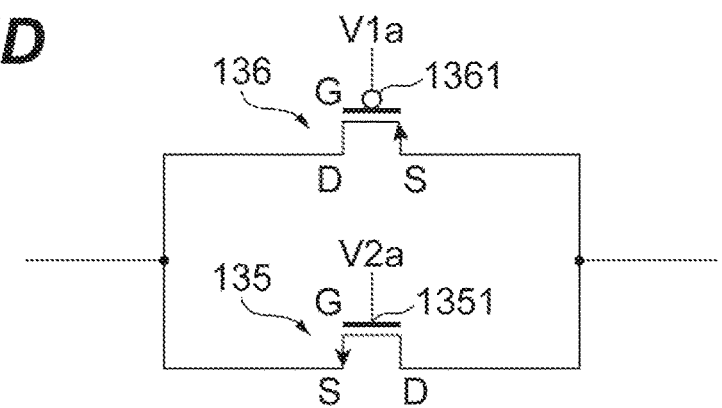

FIGS. 4A to 4C are circuit diagrams each showing a configuration example of the pole-zero compensation circuit 130, while FIG. 4D shows an example of a circuit constituting a resistance element 132 shown in FIGS. 4A to 4C. A pole-zero compensation circuit 130A shown in FIG. 4A includes a capacitive element 131 and the resistance element 132 connected in parallel to each other. A pole-zero compensation circuit 130B shown in FIG. 4B has the configuration of the pole-zero compensation circuit 130A in FIG. 4A, and also includes a resistance element 133 disposed between the output side terminals of the capacitive element 131 and the resistance element 132 and a reference potential line. A pole-zero compensation circuit 130C shown in FIG. 4C has the configuration of the pole-zero compensation circuit 130A in FIG. 4A, and also includes a resistance element 134 connected in series to the capacitive element 131, and connected in parallel to the resistance element 132. The resistance element 132 in FIGS. 4A to 4C may be constituted by a normal resistor, or may be constituted by one MOSFET. Moreover, the resistance element 132 in FIGS. 4A to 4C is preferably constituted by a circuit where an n-type MOSFET 135 and a p-type MOSFET 136 are connected in parallel as shown in FIG. 4D. Appropriate fixed potentials V1a and V2a are connected to gates 1351 and 1361 of the n-type MOSFET 135 and the p-type MOSFET 136, respectively. For adopting any one of the circuit configurations, the time constant of the pole-zero compensation circuit 130 is set to a value matched with the time constant of the preamplifier 120 (time constant determined by capacity value of capacitive element 122 and resistance values of MOSFETs 123 and 124). In this case, following settings are preferably taken into consideration to increase gains of signals of the preamplifier 120 and the waveform shaping circuit 140.

(a) The capacity value of the capacitive element 122 of the preamplifier is set to a value smaller than the capacity value of the capacitive element 131 of the pole-zero compensation circuit 130.

(b) Each of the resistance value of the MOSFETs 123 and 124 of the preamplifier 120 is set to a value larger than the resistance value of the resistance element 132 of the pole-zero compensation circuit 130 or of each of the n-type MOSFET 135 and the p-type MOSFET 136 (settings of fixed potentials V1a and V2a).

Figure 5:
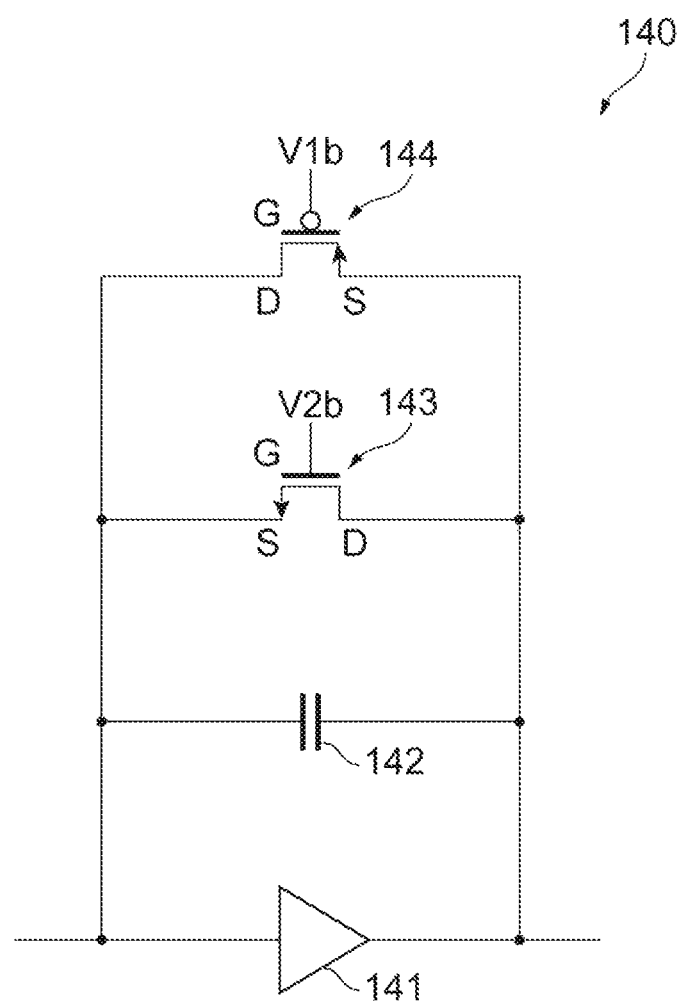
FIG. 5 is a circuit diagram showing a configuration example of a waveform shaping circuit included in the photon detector according to the first embodiment.

The waveform shaping circuit 140 is a circuit for shaping a waveform of output of the preamplifier 120. FIG. 5 is a circuit diagram showing a configuration example of the waveform shaping circuit 140. As shown in FIG. 5, the waveform shaping circuit 140 is a circuit having a configuration similar to the configuration of the preamplifier 120 shown in FIG. 2. Specifically, the waveform shaping circuit 140 includes an amplifier 141, and includes a capacitive element 142, an n-type MOSFET 143, and a p-type MOSFET 144 disposed on a plurality of wirings electrically connecting the input end side and the output end side of the amplifier 141. The time constant determined by the capacity value of the capacitive element 142 and the resistance value between the drain and source of each of the MOSFETs 143 and 144 is set to a value smaller than the time constant determined by the capacity value of the capacitive element 122 in the preamplifier 120 shown in FIG. 2 and the resistance value between the drain and source of each of the MOSFETs 123 and 124 (settings of fixed potentials V1$b$ and V2$b$). The waveform shaping circuit 140 is not required to include both the n-type MOSFET 143 and the p-type MOSFET 144. More specifically, for example, adopted may be such a circuit which includes, together with the capacitive element 142, only the n-type MOSFET 143 corresponding one of the pair of the n-type MOSFET 143 and the p-type MOSFET 144 of the waveform shaping circuit 140 and disposed on each of a plurality of wirings electrically connecting the input end side and the output end side of the amplifier 141.

Figure 6A:
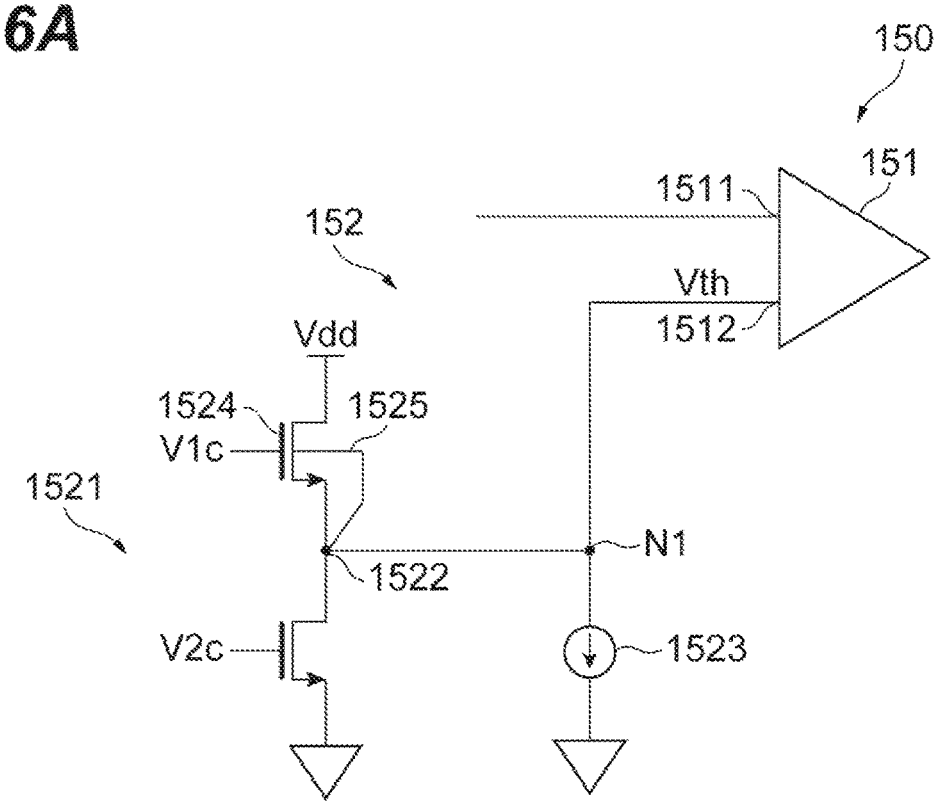
FIGS. 6A and 6B are circuit diagrams showing configuration examples of a comparator included in the photon detector according to the first embodiment.
Figure 6B:
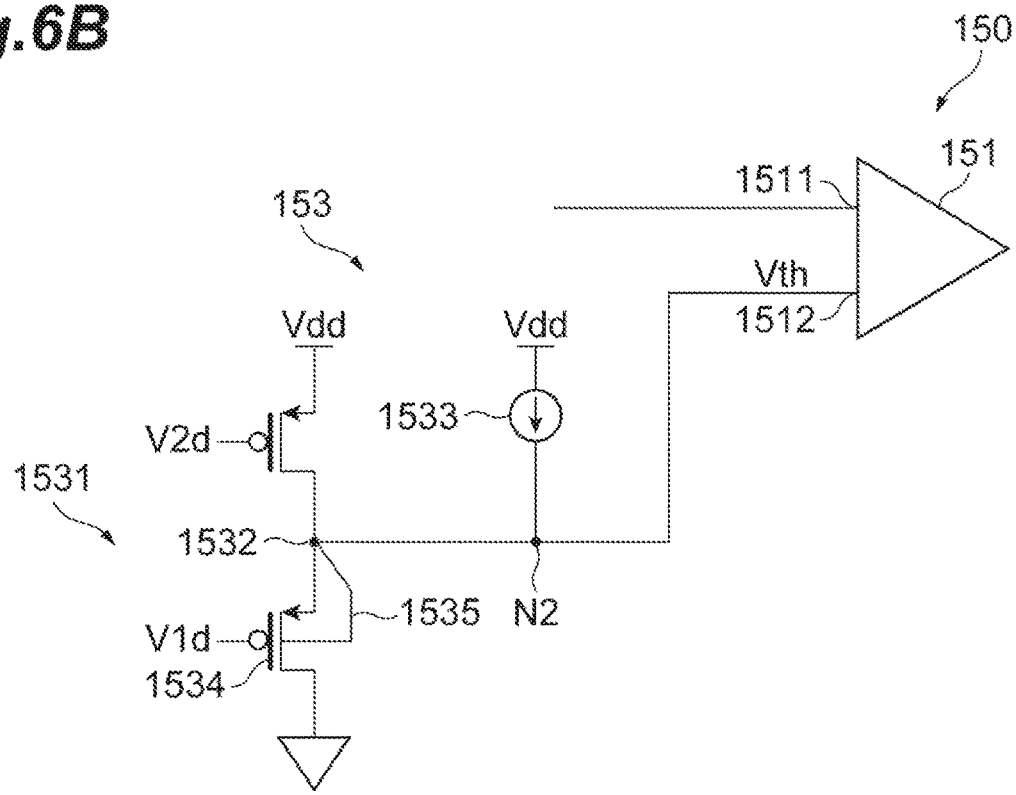

The comparator 150 is a circuit which compares the output voltage of the waveform shaping circuit 140 with a reference voltage Vth, and outputs a pulse each time the output voltage of the waveform shaping circuit 140 exceeds the reference voltage Vth. FIG. 6A is a circuit diagram showing a configuration example of the comparator 150, while FIG. 6B is a circuit diagram showing another configuration example of the comparator 150. FIGS. 6A and 6B are different from each other in a configuration of a reference voltage generation circuit. As shown in FIGS. 6A and 6B, the comparator 150 includes a comparator 151, and a reference voltage generation circuit 152 or 153. An input electrode 1511 of the comparator 151 is connected to an output end of the waveform shaping circuit 140, while another input electrode 1512 is connected to an output end of the reference voltage generation circuit 152 or 153.

The reference voltage generation circuit 152 includes a source follower circuit 1521 including two n-type MOSFETs connected in series to each other, and a variable current source 1523 connected to an output node 1522 of the source follower circuit 1521. A node N1 between the output node 1522 and the variable current source 1523 is connected to the other input electrode 1512 of the comparator 151. The source follower circuit 1521 includes an n-type MOSFET (input MOSFET) 1524, and another n-type MOSFET constituting a current mirror resistor. A back gate 1525 of the n-type MOSFET 1524 of the source follower circuit 1521 is connected (short-circuited) to the output node 1522 of the source follower circuit 1521. A fixed potential V1$c$ is a potential slightly higher than the potential of the output node 1522. The potential difference between the fixed potential V1$c$ and the output node 1522 is set to a value equal to or smaller than a threshold of the n-type MOSFET 1524. The current mirror resistor constituted by the other n-type MOSFET is defined by a fixed potential V2$c$ connected to the gate of the other n-type MOSFET.

The reference voltage generation circuit 153 includes a source follower circuit 1531 including two p-type MOSFETs connected in series to each other, and a variable current source 1533 connected to an output node 1532 of the source follower circuit 1531. A node N2 between the output node 1532 and the variable current source 1533 is connected to the other input electrode 1512 of the comparator 151. The source follower circuit 1531 is constituted by an p-type MOSFET (input MOSFET) 1534, and another p-type MOSFET constituting a current mirror resistor. A back gate 1535 of the p-type MOSFET 1534 of the source follower circuit 1531 is connected (short-circuited) to the output node 1532 of the source follower circuit 1531. A fixed potential V1$d$ is a potential slightly lower than the potential of the output node 1532. The potential difference between the fixed potential V1$d$ and the output node 1532 is set to a value equal to or smaller than a threshold of the p-type MOSFET 1534. The current mirror resistor constituted by the other n-type MOSFET is defined by a fixed potential V2$c$ connected to the gate of the other n-type MOSFET.

The counter 160 is a circuit which counts the number of pulses outputted from the comparator 150. The counter 160 may be any types of circuit as long as the function of counting the number of pulses can be performed.

(Operation)

The photon detector 100 configured as described above operates in a following manner.

When a photon enters the sensor element 110, the sensor element 110 initially outputs the number of electrons corresponding to magnitude of energy of the incident photon. The output electrons are inputted to the preamplifier 120. When electrons having negative charges are inputted from the sensor element 110 to the preamplifier 120, the potential of the input electrode of the amplifier 121 is maintained at the reference potential (potential on input electrode side of amplifier 121). The potential of the output side of the amplifier 121 rises by a voltage proportional to the charge amount of the input electrons.

The potential difference between both the ends of each of the capacitive element 122, the n-type MOSFET 123, and the p-type MOSFET 124 is equal to the output voltage V0 of the amplifier 121. In case of the n-type MOSFET 123, the side (second electrode) connected to the output electrode of the amplifier 121 becomes the drain. In case of the p-type MOSFET 124, however, the side (second electrode) connected to the output electrode of the amplifier 121 becomes the source. Accordingly, a drain voltage Vds as viewed on the basis of the source becomes a positive value in the n-type MOSFET 123, but becomes a negative value in the p-type MOSFET 124.

When the first fixed potential V1 connected to the gate 1231 of the n-type MOSFET 123 is set to a value higher than the reference potential by an appropriate value equal to or lower than a threshold voltage of the n-type MOSFET 123, for example, the n-type MOSFET 123 operates within a subthreshold range (weak inversion range). Accordingly, the resistance value between the drain and source of the n-type MOSFET 123 becomes a value ranging from several hundred kilohms to several ten megohms in a range where the output voltage V0 of the amplifier 121 is relatively low. On the other hand, this resistance value approaches infinity as the output voltage V0 of the amplifier 121 increases. This situation is indicated by points A and B in FIG. 7. Specifically, in a range where the output voltage V0 of the amplifier 121 is relatively low, an operating point of the n-type MOSFET 123 is located around the point A, for example. However, as the output voltage V0 of the amplifier 121 increases, the operating point moves toward the vicinity of the point B along a dashed arrow, for example.

Concerning the p-type MOSFET 124 next, the drain voltage Vds as viewed on the basis of the source becomes a value of the output voltage V0 of the amplifier 121 with the opposite sign. On the other hand, a gate voltage Vgs as viewed on the basis of the source becomes a value obtained by adding a differential voltage (fixed voltage) between the second fixed potential V2 and the reference potential to the drain voltage Vds. Accordingly, when the second fixed potential V2 is set to an appropriate value, the resistance value between the drain and source of the p-type MOSFET 124 becomes almost infinite in a range where the output voltage V0 of the amplifier 121 is lower than a predetermined value. On the other hand, this resistance value changes to a lower value when the output voltage V0 of the amplifier 121 exceeds the predetermined value. This situation is indicated by points C and D in FIG. 7. Specifically, in the range where the output voltage V0 of the amplifier 121 is lower than the predetermined value, an operating point of the p-type MOSFET 124 is located around the point C, for example. However, as the output voltage V0 of the amplifier 121 increases, the operating point moves toward the vicinity of the point D along a dashed arrow, for example.

The n-type MOSFET 123 and the p-type MOSFET 124 operate in the manner described above. Accordingly, the discharge time constant of the preamplifier 120 becomes relatively large when the output voltage V0 of the amplifier 121 is low. However, the discharge time constant decreases as the output voltage V0 of the amplifier 121 increases.

Figure 7:
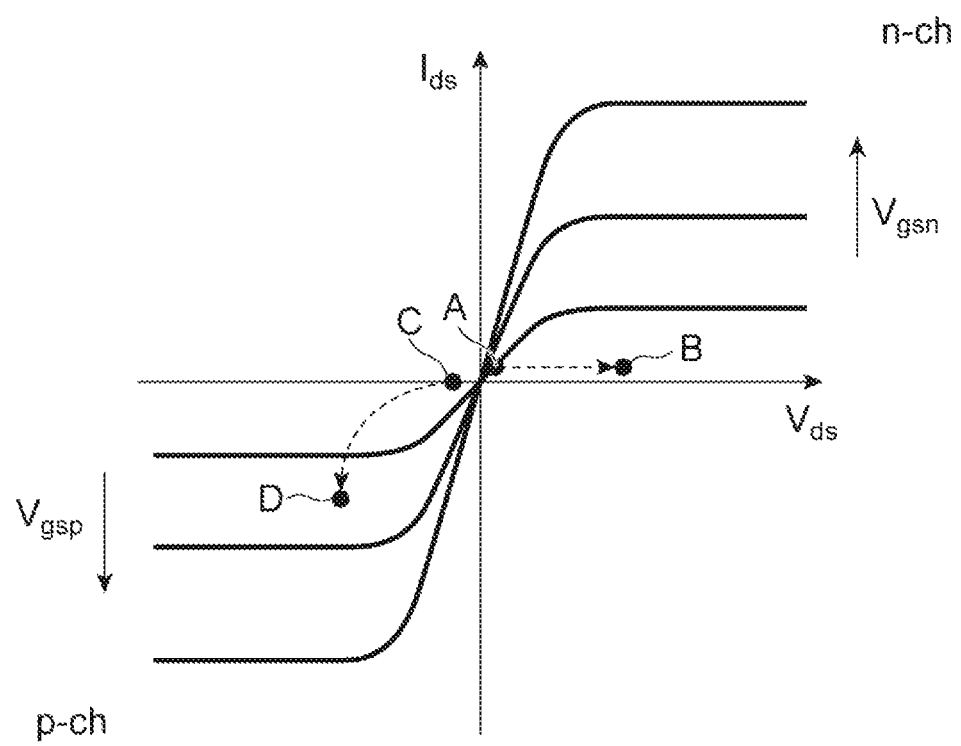
FIG. 7 is a diagram showing voltage-current characteristics of an ordinary MOSFET, and an operation of an n-type MOSFET and a p-type MOSFET according to the first embodiment.

In FIG. 7, Ids on the vertical axis represents a current value between the drain and source, while Vds on the horizontal axis represents a voltage value between the drain and source. In addition, Vgsn is a voltage between the gate and source of the n-type MOSFET 123, while Vgsp is a voltage between the gate and source of the p-type MOSFET 124. Voltage-current characteristics of the n-type MOSFET 123 and the p-type MOSFET 124 change in accordance with changes of the voltages Vgsn and Vgsp between the gate and source as shown in FIG. 7.

Figure 8:
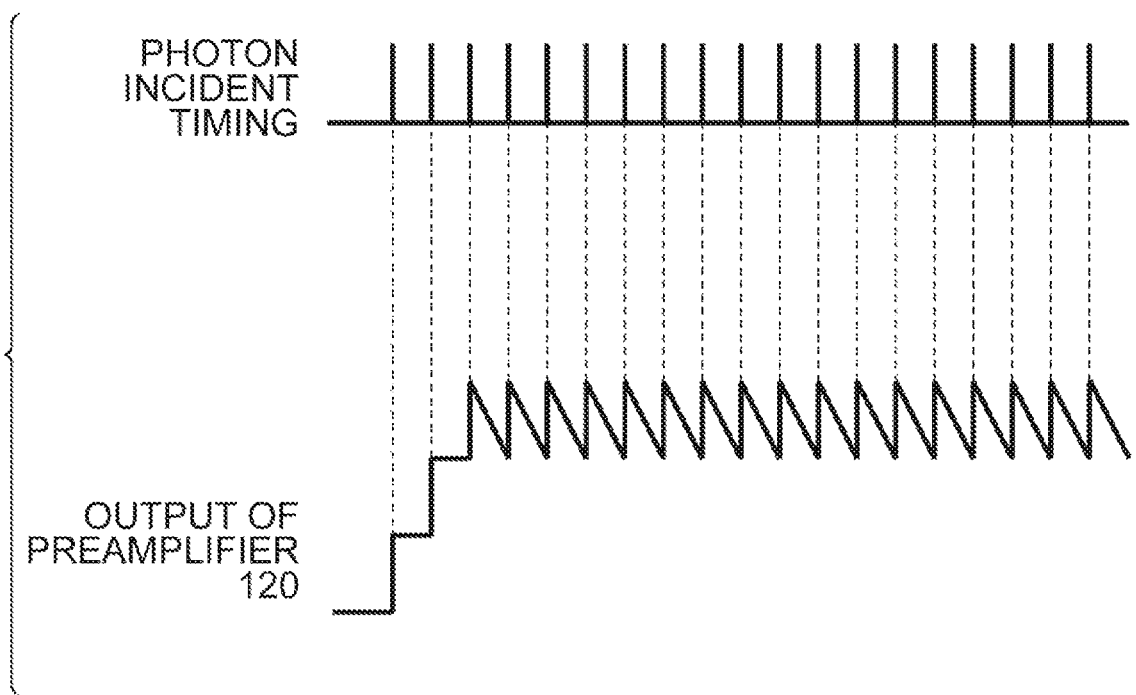
FIG. 8 is a schematic diagram of a waveform representing an operation of the preamplifier according to the first embodiment.
Figure 9:
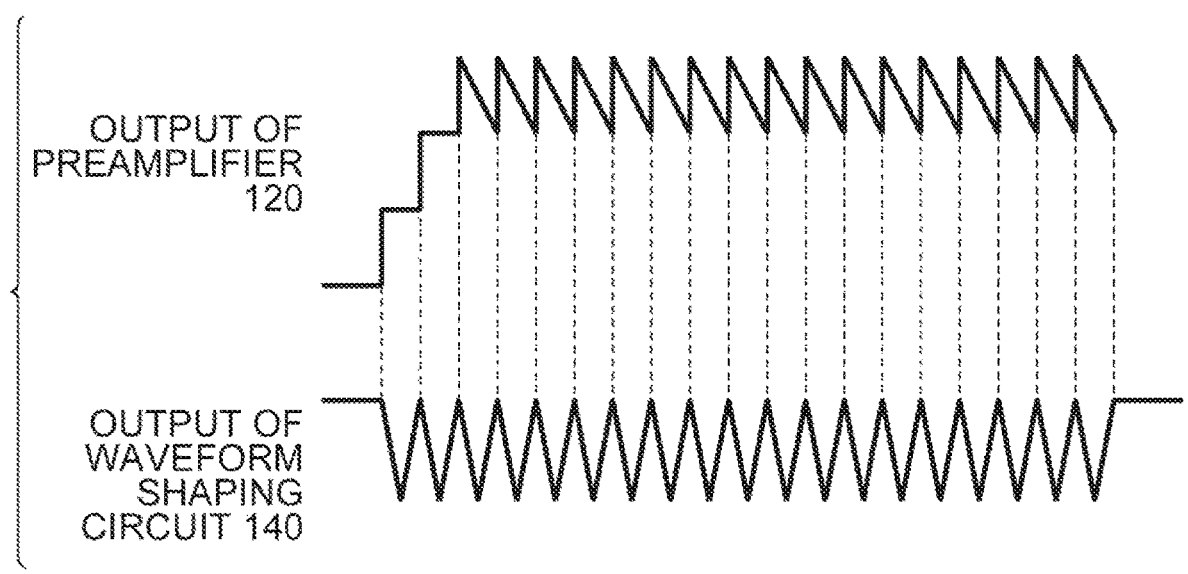
FIG. 9 is a schematic diagram of a waveform representing an operation of the waveform shaping circuit according to the first embodiment.
Figure 10:
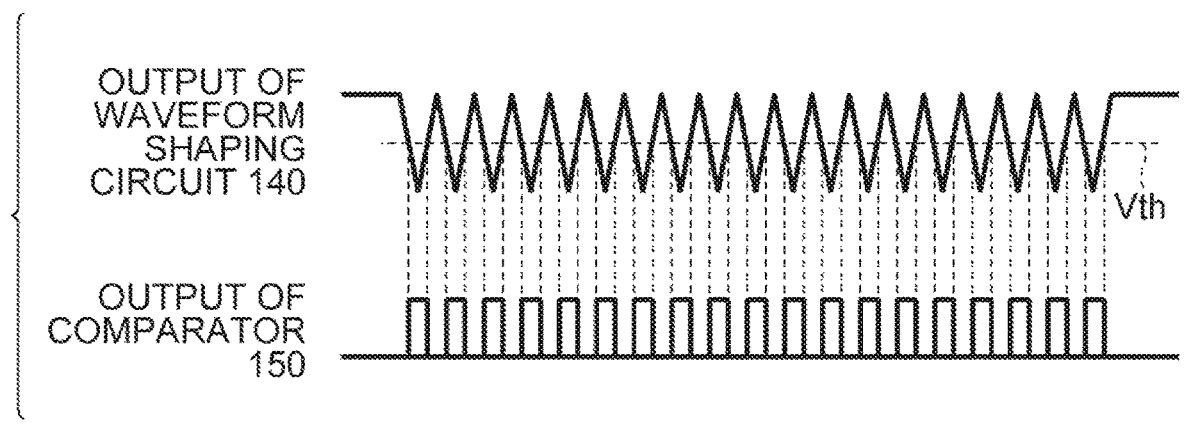
FIG. 10 is a schematic diagram of a waveform representing an operation of the comparator according to the first embodiment.

FIG. 8 is a diagram schematically showing incident timing of a photon and an output waveform of the preamplifier 120. As shown in FIG. 8, the discharge time constant of the preamplifier 120 is relatively large when the output voltage of the preamplifier 120 (same as output voltage V0 of amplifier 121) is low. Accordingly, the output voltage of the preamplifier 120 only slightly decreases (output voltage of preamplifier 120 rises substantially stepwise every time photon enters). However, when the output voltage of the preamplifier 120 increases to a certain level or higher, the discharge time constant of the preamplifier 120 decreases. In this case, the output voltage of the preamplifier 120 rapidly decreases, and outputs a waveform having a sawtooth shape. FIG. 9 is a schematic diagram of a waveform representing an operation of the waveform shaping circuit 140, while FIG. 10 is a schematic diagram of a waveform representing an operation of the comparator 150.

An output signal having the waveform shown in FIG. 8 and outputted from the preamplifier 120 is inputted to the waveform shaping circuit 140 via the pole-zero compensation circuit 130. The pole-zero compensation circuit 130 is a circuit for reducing a change of a baseline in the output signal of the waveform shaping circuit 140 (horizontal line in waveform shown in lower part in FIG. 9), which change has been produced by a low frequency component of the output of the preamplifier 120. For example, even when the output of the preamplifier 120 gradually decreases after continuation of no input to the preamplifier 120 for a certain period, the pole-zero compensation circuit 130 operates to reduce a change of the baseline of the output of the waveform shaping circuit 140.

The waveform shaping circuit 140 shapes the waveform shown in the lower part of FIG. 8 and received from the preamplifier 120, i.e., the waveform shown in the upper part of FIG. 9, into the waveform shown in the lower part of FIG. 9 (waveform suitable for comparison by comparator 150 in subsequent stage). The output voltage from the waveform shaping circuit 140 is compared with the reference voltage Vth outputted from the reference voltage generation circuit 152 in the comparator 150. As shown in a lower part of FIG. 10, the comparator 150 outputs a pulse every time the output voltage of the waveform shaping circuit 140 becomes lower than the reference voltage Vth. The reference voltage Vth outputted from the reference voltage generation circuit 152 is adjusted by adjusting a current value of the variable current source 1523. The pulse outputted from the comparator 150 is counted by the counter 160. A count value thus obtained is outputted as a numeral representing the number of incident photons.

(Effect)

According to the present embodiment, the n-type MOSFET 123 and the p-type MOSFET 124 function as resistors. Accordingly, the preamplifier 120 provided herein includes a resistor having a small volume but a large resistance value.

Figure 11A:
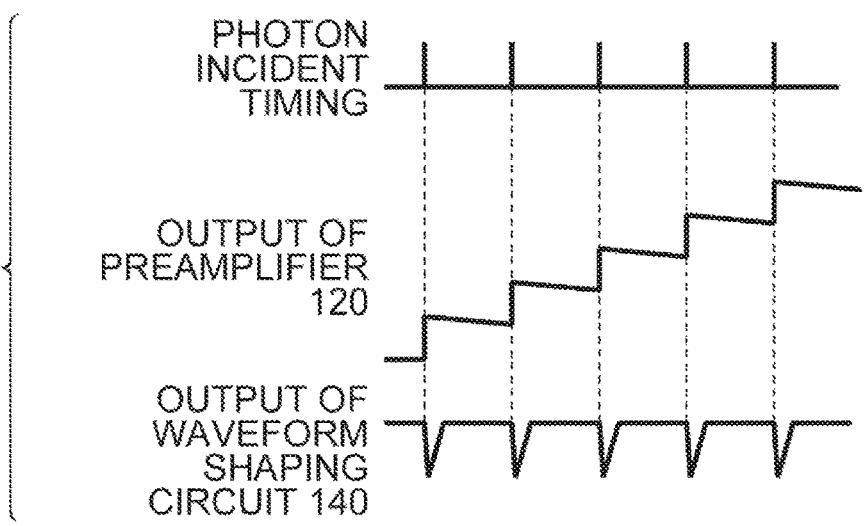
Figure 11B:
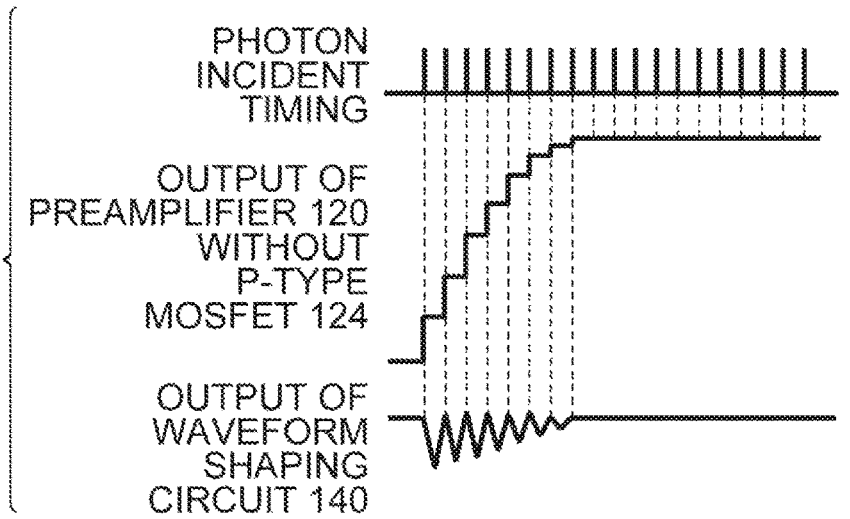
Figure 11C:
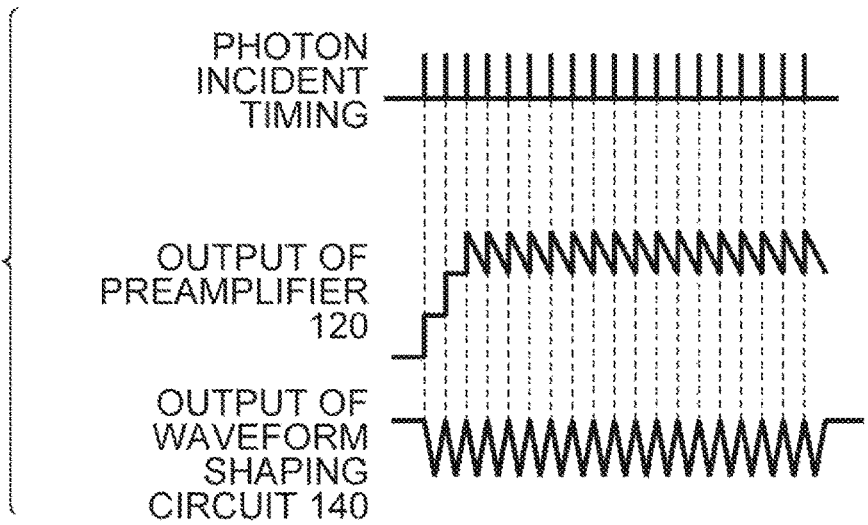

According to the present embodiment, the resistance value of the p-type MOSFET 124 is allowed to lower in such a voltage range of the amplifier output V0 where the resistance value of the n-type MOSFET 123 approaches infinity (i.e., saturation of amplifier output V0 is avoidable). This effect is shown in FIGS. 11A to 11C. FIG. 11A is a waveform diagram of respective parts when the number of incident photons per unit time is small. In this case, the presence or absence of the p-type MOSFET 124 produces no waveform difference. FIG. 11B is a waveform diagram of respective parts when the number of incident photons per unit time increases in the absence of the p-type MOSFET 124. FIG. 11C is a waveform diagram of respective parts when the number of incident photons per unit time increases in the presence of the p-type MOSFET 124. When the number of incident photons per unit time is small, the output of the preamplifier 120 increases stepwise in accordance with the incident timing of photons regardless of the presence or absence of the p-type MOSFET 124 as shown in FIG. 11A. In this case, the waveform shaping circuit 140 can output a waveform corresponding to the incident timing of the photons. However, when the number of incident photons per unit time increases in the absence of the p-type MOSFET 124 as shown in FIG. 11B, the output of the preamplifier 120 is saturated. In this case, the waveform shaping circuit 140 cannot output a waveform. On the other hand, in the presence of the p-type MOSFET 124 as in the present embodiment, the preamplifier 120 does not become saturated even when the number of incident photons per unit time increases. Accordingly, the waveform shaping circuit 140 can output a waveform in accordance with the incident timing of photons.

According to the present embodiment, the voltage range where the n-type MOSFET 123 functions as an appropriate resistor, and the voltage range where the p-type MOSFET 124 functions as an appropriate resistor are individually adjustable by the first fixed potential V1 and the second fixed potential V2. Accordingly, in comparison with the integration circuit of Patent Document 1 and a circuit which removes the n-type MOSFET 123 from the present embodiment and allows only the p-type MOSFET 124 to function as a resistor, the preamplifier 120 of the present embodiment is applicable to a wide voltage range, and can become a circuit not easily causing saturation.

In addition, for obtaining an appropriate resistance value by using one transistor having a gate (base) connected to a drain (collector) as Patent Document 1, adjustable parameters to be provided are only respective sizes and materials of the one transistor. In this case, the degree of designing freedom decreases, wherefore adjustment for obtaining an appropriate resistance value may become difficult. According to the present embodiment, however, the fixed potentials V1 and V2 supplied to the control electrode are adjustable as well as various sizes (e.g., gate length, gate width) and materials of the n-type MOSFET 123 and the p-type MOSFET 124. Accordingly, the present embodiment achieves a higher degree of designing freedom, and easy adjustment for obtaining an appropriate resistance value.

According to the present embodiment, the first transistor is an n-type MOSFET 123, while the second transistor is a p-type MOSFET 124. Accordingly, more reduction of power consumption, and more reduction of the size of the photon detector are achievable in the present embodiment than in a configuration which uses bipolar transistors as the first and second transistors.

According to the present embodiment, the pole-zero compensation circuit 130 is provided between the preamplifier 120 and the waveform shaping circuit 140. In this case, a change of the baseline in the output of the waveform shaping circuit 140 (horizontal line in lower waveform in FIG. 9) as a change produced by the low frequency component of the output of the preamplifier 120 decreases, wherefore accuracy in discriminating magnitude of incident photon energy by the comparator 150 improves. This effect is also more advantageous in comparison with the semiconductor X-ray detector including the integration circuit of Patent Document 1. Specifically, the pole-zero compensation circuit 130 herein is a circuit difficult to adopt in the post stage of the integration circuit of Patent Document 1. The reason why this circuit is difficult to adopt is that matching between the integration circuit of the Patent Document 1 and the pole-zero compensation circuit is difficult by a difficulty in free adjustment of the resistance value of the transistor (because resistance value is determined only by potentials of source (emitter) and drain (collector) and size of transistor). According to the present embodiment, the first fixed potential V1 and the second fixed potential V2 can be adjusted to any potentials, wherefore no difficulty is produced in this point.

According to the present embodiment, the comparator 150 includes the reference voltage generation circuits 152 and 153 which include the source follower circuits 1521 and 1531, and the variable current sources 1523 and 1533 connected to the output nodes 1522 and 1532 of the source follower circuits 1521 and 1531, respectively. According to this configuration, easy and high-accuracy adjustment of detection sensitivity can be made for each pixel when the photon detector is provided for each pixel (configuration including sensor element 110 and single signal processing system with one-to-one correspondence). The back gates 1525 and 1535 of the input MOSFETs 1524 and 1534 of the source follower circuits 1521 and 1531 are connected to the output nodes 1522 and 1532 of the source follower circuits 1521 and 1531, respectively. This configuration improves linearity of a change of the output voltage Vth of each of the source follower circuits 1521 and 1531 with respect to a current change of the variable current sources 1523 and 1533, and widens the variable range of the output voltage Vth.

Second Embodiment

Figure 12:
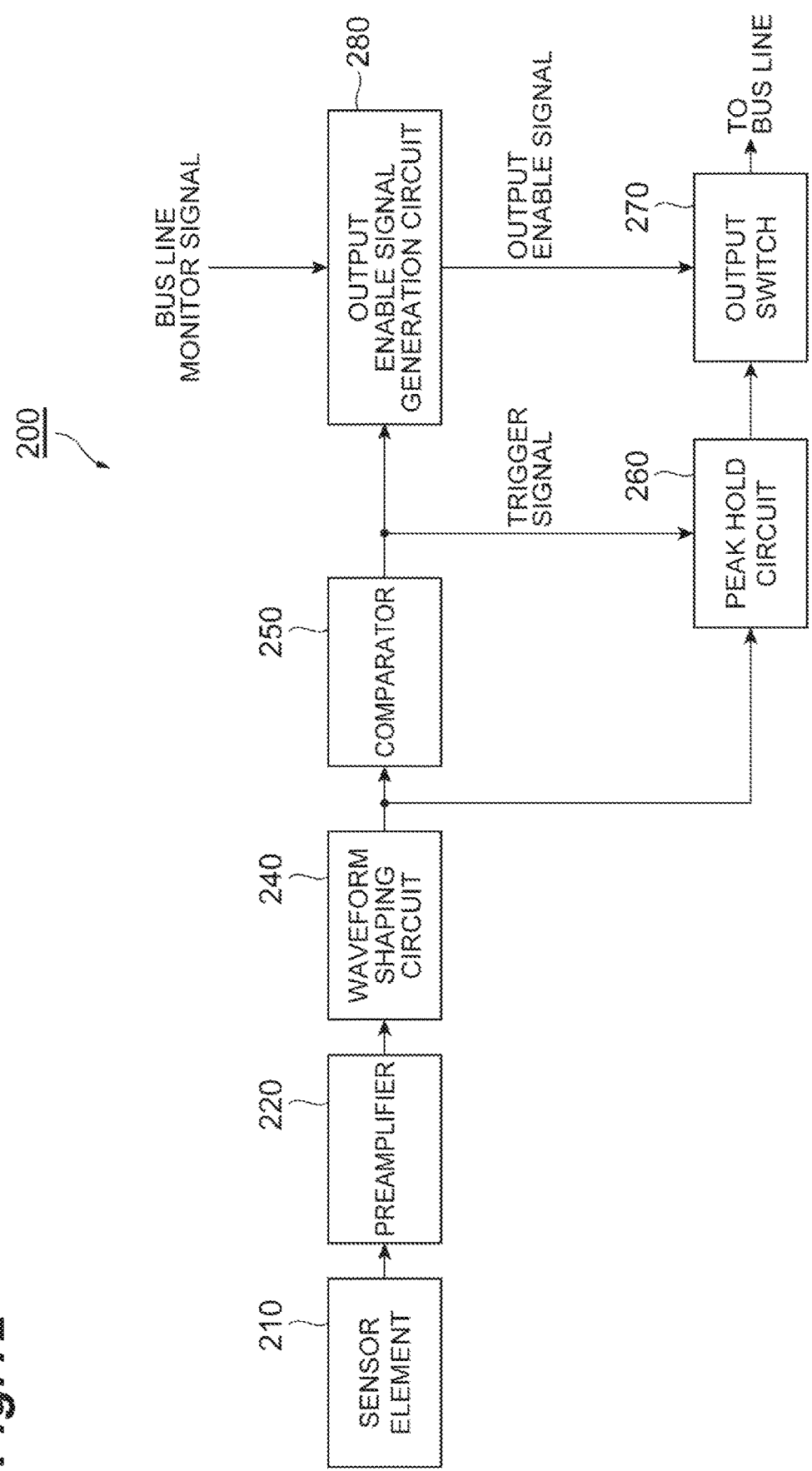
FIG. 12 is a block diagram showing a configuration example of a photon detector according to a second embodiment.

FIG. 12 is a block diagram showing a configuration of a photon detector 200 according to a second embodiment. As obvious from a comparison between FIGS. 1 and 12, the photon detector 200 of the second embodiment is different from the photon detector 100 of the first embodiment chiefly in that a peak hold circuit 260, an output switch 270, an output enable signal generation circuit 280 are provided instead of the counter 160 of the first embodiment. A specific configuration of the peak hold circuit 260 is disclosed in Non-Patent Document 1 (FIG. 6) and Non-Patent Document 2 described above. A specific configuration of the output enable signal generation circuit 280 is disclosed in Non-Patent Document 3 and Non-Patent Document 4 described above. In the first embodiment (FIG. 1), the pole-zero compensation circuit 130 is provided between the preamplifier 120 and the waveform shaping circuit 140. A pole-zero compensation circuit may be similarly provided between the preamplifier 220 and the waveform shaping circuit 240 in the second embodiment. As for other parts, the first embodiment and the second embodiment have common configurations. The parts different from the corresponding parts in the first embodiment will be hereinafter chiefly described.

As shown in FIG. 12, the photon detector 200 according to the present embodiment includes a sensor element 210 (having structure identical to structure of sensor element 110), a preamplifier 220 (having structure identical to structure of preamplifier 120), a waveform shaping circuit 240 (having structure identical to structure of waveform shaping circuit 140), a comparator 250 (having structure identical to structure of comparator 150), the peak hold circuit 260, the output switch 270, and the output enable signal generation circuit 280. The sensor element 210, the preamplifier 220, the waveform shaping circuit 240, the peak hold circuit 260, and the output switch 270 of these circuit elements are connected in series in this order. The comparator 250 has an input connected to an output of the waveform shaping circuit 240, and an output supplied to the peak hold circuit 260 and the output enable signal generation circuit 280. The preamplifier 220, the waveform shaping circuit 240, the comparator 250, the peak hold circuit 260, the output switch 270, and the output enable signal generation circuit 280 constitute a single signal processing system provided for the sensor element 210 with one-to-one correspondence.

The sensor element 210, the preamplifier 220, the waveform shaping circuit 240, and the comparator 250 have the same configurations as the configurations of the sensor element 110, the preamplifier 120, the waveform shaping circuit 140, and the comparator 150 of the first embodiment, respectively, and therefore are not repeatedly explained herein.

The peak hold circuit 260 is a circuit which holds a peak value of output of the waveform shaping circuit 240, and outputs the held peak value to a bus line (common signal line) via the output switch 270.

The output enable signal generation circuit 280 outputs an output enable signal to the output switch 270 based on a bus line monitor signal for determining whether or not the bus line is busy (whether or not signal has been read from another pixel circuit to bus line), and based on output of the comparator 250.

The output switch 270 is a circuit which outputs the peak value held by the peak hold circuit 260 to the bus line (common signal line) when the output enable signal from the output enable signal generation circuit 280 indicates output enable.

The waveform shaping circuit 240 may be constituted by two waveform shaping circuits to which common output is inputted from the preamplifier 220 to output independent output for each. In this case, output of one of the waveform shaping circuits is supplied to the comparator 250, while output of another waveform shaping circuit is connected to the peak hold circuit 260.

Output of the comparator 250 may also be supplied to a circuit other than the peak hold circuit 260 and the output enable signal generation circuit 280, such as a circuit corresponding to the counter 160 in FIG. 1.

The peak hold circuit 260, the output switch 270, and the output enable signal generation circuit 280 of the photon detector 200 configured as described above hold the peak value of output of the waveform shaping circuit 240 in cooperation with each other, and operate to output the held peak value to the bus line at timing defined by the output of the comparator 250. In this manner, the photon detector 200 is allowed to output a signal proportional to magnitude of incident photon energy to the bus line.

The present invention is not limited to the first and second embodiments of the present invention described herein. For example, according to the first embodiment described above, only the single comparator 150 and the single counter 160 are provided to discriminate energy of photons only in one level. However, in the first embodiment, photon energy may be discriminated in a plurality of levels to count energy for each level by providing a plurality of comparators having different reference voltages and a plurality of counters corresponding to the respective comparators. In this case, a configuration of an X-ray imaging device or the like capable of obtaining more information can be provided. In addition, effectiveness of the pole-zero compensation circuit can be enhanced by this configuration.

In the second embodiment described above, the pole-zero compensation circuit is eliminated. However, a pole-zero compensation circuit similar to the pole-zero compensation circuit 130 may be provided between the preamplifier 220 and the waveform shaping circuit 240 in the second embodiment. In this case, accuracy in detecting magnitude of incident photon energy improves.

In the first embodiment described above, the pole-zero compensation circuit 130 is provided between the preamplifier 120 and the waveform shaping circuit 140. However, the pole-zero compensation circuit 130 may be eliminated if various conditions are met.

In the respective embodiments described above, the sensor element 110 which outputs electrons according to magnitude of incident photon energy is adopted as an example of the sensor element. However, the present invention is not limited to this example. The sensor element may be a sensor element which outputs holes according to magnitude of incident photon energy.

In the respective embodiments described above, the first transistor is the n-type MOSFET 123, while the second transistor is the p-type MOSFET 124. However, the present invention is not limited to this example. For example, when a sensor element which outputs holes is adopted, it is preferable that the first transistor constituted by a p-type MOSFET, and the second transistor constituted by an n-type MOSFET are used. Each of the first and second transistors is not limited to an MOSFET. For example, each of the first and second transistors may be a bipolar transistor. In this case, an npn-type bipolar transistor is used in place of the n-type MOSFET, while a pnp-type bipolar transistor is used in place of the p-type MOSFET. In addition, base, emitter and collector of each bipolar transistor correspond to gate, source and drain of each MOSFET, respectively. In this manner, each bipolar transistor operates similarly to each MOSFET.

In the respective embodiments described above, the waveform shaping circuit 140 has the circuit configuration shown in FIG. 5 (either one of MOSFETs 143 and 144 in FIG. 5 may be eliminated as described above). However, the present invention is not limited to this example. For example, instead of the MOSFETs 143 and 144 shown in FIG. 5, any resistance element such as a resistance element constituted by a resistor may be used.

In the respective embodiments described above, as shown in FIG. 10, the waveform shaping circuit 140 is of an inverting output type, while the comparator 150 is a comparator which outputs a pulse every time the output from the waveform shaping circuit 140 becomes lower than the reference voltage Vth. However, the waveform shaping circuit may be of a non-inverting output type, while the comparator 150 may be a comparator which outputs a pulse every time the output of the waveform shaping circuit exceeds a predetermined reference voltage.

In the respective embodiments described above, the comparator 150 includes the reference voltage generation circuits 152 and 153 which include the source follower circuits 1521 and 1531, and the variable current sources 1523 and 1533 connected to the output nodes 1522 and 1532 of the source follower circuits 1521 and 1531, respectively. However, the present invention is not limited to this example. For example, the reference voltage generation circuit may be eliminated from the comparator. In this case, a reference voltage may be supplied to the comparator from the outside. Moreover, the comparator may include a reference voltage generation circuit not including a source follower circuit.

In the respective embodiments described above, the back gates 1525 and 1535 of the input MOSFETs 1524 and 1534 of the source follower circuits 1521 and 1531 are connected to the output nodes 1522 and 1532 of the source follower circuits 1521 and 1531. However, the present invention is not limited to this example. The back gate of the input MOSFET 1524 of the source follower circuit 1521 need not be connected to the output nodes 1522 and 1532 of the source follower circuits 1521 and 1531.

In the respective embodiments described above, the respective constituent elements shown in FIGS. 1 and 12 are directly connected to each other between constituent elements provided before and behind the corresponding constituent elements. However, the present invention is not limited to this example. A circuit not described in the respective embodiments described above, such as a current amplifier, may be interposed between the respective constituent elements.

REFERENCE SIGNS LIST 100, 200 . . . Photon detector; 110, 210 . . . Sensor element; 120, 220 . . . Preamplifier; 130 . . . Pole-zero compensation circuit; 140, 240 Waveform shaping circuit; 150, 250 . . . Comparator; 160 . . . Counter; 121 . . . Amplifier (first amplifier); 121A . . . Post-stage amplifier (second amplifier); 122 . . . Capacitive element; 123 . . . n-type MOSFET (first transistor); 124 . . . p-type MOSFET (second transistor); 142 . . . Capacitive element; 143, 144 . . . MOSFET; 151 . . . Comparator; 152 . . . Reference voltage generation circuit; 1231 . . . Gate (control electrode) of n-type MOSFET (first transistor); 1241 . . . Gate (control electrode) of p-type MOSFET (second transistor); 1511 . . . An input electrode of comparator; 1512 . . . Another input electrode of comparator; 1521, 1531 . . . Source follower circuit; 1522, 1532 . . . Output node of source follower circuit; 1523, 1533 . . . Variable current source; 1524, 1534 ... Input MOSFET of source follower circuit; 1525, 1535 ... Input MOSFET back gate; 260 ... Peak hold circuit; 270 ... Output switch; and 280 ... Output enable signal generation circuit.

The invention claimed is:

1. A photon detector comprising:
   a sensor element configured to output electrons or holes according to magnitude of energy of an incident photon;
   a preamplifier electrically connected to the sensor element, the preamplifier configured to receive charges of the electrons or holes outputted from the sensor element and amplify a voltage signal converted from an integrated value of the charges;
   a waveform shaping circuit electrically connected to the preamplifier, the waveform shaping circuit configured to receive an output signal from the preamplifier and shape a waveform of the output signal received from the preamplifier; and
   a comparator electrically connected to the waveform shaping circuit, the comparator configured to receive an output signal from the waveform shaping circuit and output a pulse in response to reception of the output signal at a voltage level exceeding a reference voltage from the waveform shaping circuit, wherein
   the preamplifier includes:
   a first amplifier having an input end and an output end;
   a capacitive element having a first end electrically connected to the input end side of the first amplifier, and a second end electrically connected to the output end side of the first amplifier;
   a first transistor configured such that a resistance value increases with increase in an absolute value of an output voltage of the first amplifier, the first transistor having a first electrode electrically connected to the input end side of the first amplifier, a second electrode electrically connected to the output end side of the first amplifier, and a control electrode connected to a first fixed potential; and
   a second transistor having a conductivity type different from a conductivity type of the first transistor and configured such that a resistance value decreases with increase in the absolute value of the output voltage of the first amplifier, the second transistor having a first electrode electrically connected to the input end side of the first amplifier, a second electrode electrically connected to the output end side of the first amplifier, and a control electrode connected to a second fixed potential, and wherein
   the first fixed potential and the second fixed potential are individually set at any respective potential.

2. The photon detector according to claim 1, wherein
   the preamplifier further includes one or more second amplifiers disposed in series on the output end side of the first amplifier for multistage amplification of a signal input to the input end of the first amplifier, and
   each of the second end of the capacitive element, the second electrode of the first transistor, and the second electrode of the second transistor is set to a potential identical to a potential of either one of the output ends of the first and second amplifiers.

3. The photon detector according to claim 1, further comprising a counter configured to count the number of pulses outputted from the comparator.

4. The photon detector according to claim 1, further comprising a peak hold circuit configured to hold a peak value of the output signal from the waveform shaping circuit and output an electric signal corresponding to the peak value held at timing defined by the output signal of the comparator.

5. The photon detector according to claim 1, wherein
   the sensor element is an element configured to output electrons according to magnitude of energy of the photon,
   the first transistor is an n-type MOSFET, and
   the second transistor is a p-type MOSFET.

6. The photon detector according to claim 1, wherein
   the sensor element is an element configured to output holes according to magnitude of energy of the photon,
   the first transistor is a p-type MOSFET, and
   the second transistor is an n-type MOSFET.

7. The photon detector according to claim 1, further comprising a pole-zero compensation circuit between the preamplifier and the waveform shaping circuit.

8. The photon detector according to claim 1, wherein the comparator includes a reference voltage generation circuit including a source follower circuit, and a variable current source connected to an output node of the source follower circuit.

9. The photon detector according to claim 8, wherein a back gate of an input MOSFET constituting a part of the source follower circuit is connected to the output node of the source follower circuit.

* * * * *